United States Patent
Choi

(10) Patent No.: US 7,525,859 B2
(45) Date of Patent: Apr. 28, 2009

(54) SENSE AMPLIFIER OF SEMICONDUCTOR MEMORY DEVICE

(75) Inventor: Hong Sok Choi, Cheongju-si (KR)

(73) Assignee: Hynix Semiconductor Inc., Icheon-si (KR)

(*) Notice: Subject to any disclaimer, the term of this patent is extended or adjusted under 35 U.S.C. 154(b) by 118 days.

(21) Appl. No.: 11/823,781

(22) Filed: Jun. 27, 2007

(65) Prior Publication Data

US 2008/0123455 A1 May 29, 2008

(30) Foreign Application Priority Data

Nov. 24, 2006 (KR) ............... 10-2006-0117154

(51) Int. Cl.
*G11C 7/02* (2006.01)
(52) U.S. Cl. ................... 365/207; 365/205
(58) Field of Classification Search ............ 365/207, 365/205, 208
See application file for complete search history.

(56) References Cited

U.S. PATENT DOCUMENTS

| | | | |
|---|---|---|---|
| 5,083,295 A * | 1/1992 | Lammerts et al. | 365/205 |
| 5,508,644 A * | 4/1996 | Branson et al. | 327/57 |
| 6,075,736 A * | 6/2000 | Kim et al. | 365/207 |
| 7,133,321 B2 | 11/2006 | Jung | |
| 7,200,061 B2 | 4/2007 | Sekiguchi et al. | |
| 2005/0195672 A1* | 9/2005 | Lee | 365/207 |

FOREIGN PATENT DOCUMENTS

| | | |
|---|---|---|
| JP | 08-069694 | 3/1996 |
| KR | 10-0613462 B1 | 8/2000 |

* cited by examiner

*Primary Examiner*—Anh Phung
(74) *Attorney, Agent, or Firm*—John P. White; Cooper & Dunham LLP

(57) ABSTRACT

A sense amplifier of a semiconductor device is disclosed. The sense amplifier includes first and second PMOS transistors connected to each other at sources of the first and second PMOS transistors, and first and second NMOS transistors connected to each other at sources of the first and second NMOS transistors, to detect and amplify a voltage difference between a specific bit line and a complementary bit line. The second NMOS transistor and second PMOS transistor are connected to the specific bit line via a column select switch at drains of the second NMOS transistor and second PMOS transistor. The first PMOS transistor and first NMOS transistor are connected to the specific bit line via the column select switch at gates of the first PMOS transistor and first NMOS transistor. The second NMOS transistor, the second PMOS transistor, the first PMOS transistor, and the first NMOS transistor are arranged, in this order, downstream from the column select switch.

8 Claims, 6 Drawing Sheets

SENSE AMPLIFIER OF SEMICONDUCTOR MEMORY DEVICE

BACKGROUND

The present disclosure relates to a semiconductor memory device, and more particularly to a sense amplifier of a semiconductor memory device.

Semiconductor memory devices, which are used for storage of information, have been advancing toward low costs, miniaturization, and large capacity, in accordance with the technical advances in computer system and electronic communication fields. In particular, the miniaturization of memory chips provides a technical basis for realizing the large capacity.

Generally, a semiconductor memory device such as a DRAM device includes cell blocks each cell block consisting of a number of cells, each cell in turn including one NMOS transistor and one capacitor, and which are connected to word lines and bit lines connected in the form of a matrix.

Hereinafter, operation of such a general DRAM device will be described in brief.

When the DRAM device operates, the bit lines of one bit line pair, which have been precharged with a voltage corresponding to ½ of a core voltage Vcore in a standby mode before the operation of the DRAM device, are transited to respective voltage levels having a minute difference, as they receive data from associated cells. When a sense amplifier operates in this state, the potentials of the bit lines, which have a minute difference, are varied to levels corresponding to the core voltage vcore and a ground voltage Vss, respectively. The data on each bit line amplified in the above-mentioned manner is transferred to a data bus line in response to an output signal from a column decoder.

Meanwhile, when a read command is input after the potentials of the bit lines in each bit line pair, which have a minute difference, have been varied to the core voltage level and ground voltage level, respectively, in accordance with the amplification operation of the sense amplifier, there may be a problem in that an erroneous data inversion occurs as the potential of the bit line lower than the potential of a local input/output line is increased due to a charge sharing between the bit line and the local input/output line. This will be described with reference to FIGS. 1 to 4.

Referring to FIG. 1, a conventional bit line sense amplifier is illustrated. The conventional bit line sense amplifier includes a sensing latch 10 for amplifying a minute signal transferred from a memory cell to bit lines BLT and BLB in accordance with an input active command, an equalizer circuit 30 for precharging the bit lines BLT and BLB in accordance with a precharge command, and column select switches 20 each adapted to connect an associated one of the bit lines BLT and BLB to an associated one of local input/output lines LIOT and LIOB (FIG. 2) when a read/write command is input.

The bit line sense amplifier having the above-mentioned configuration performs an amplification operation in response to an active command when cell data has a logic value of "0". As a result, the bit line BLT is transited to a ground voltage level, and the bit line BLB is transited to a core voltage (VCORE) level, as shown in FIG. 2. When a read command is subsequently input, each local input/output line (LIOT or LIOB), which has been precharged to the core voltage level, is transited to a floating state. When a selected one of the column select switches 20 is turned on after a certain time, a charge sharing occurs between the associated bit line (BLT or BLB) and the associated local input/output line (LIOT or LIOB).

Generally, the capacitance of the local input/output lines LIO is several times as large as that of the bit lines. For this reason, when a charge sharing occurs between the associated bit line and local input/output line, the potential of the bit line BLT, which has a ground voltage level, is increased, but the potential of the bit line BLB does not vary because both the bit line BLB and the local input/output line LIOB have a core voltage (VCORE) level.

When the level of a supply voltage VDD is increased, the charge sharing occurs more easily because the gate voltage level of each column select switch 20 is increased.

However, when the potential of the bit line BLT is severely increased, an erroneous data inversion occurs. That is, the bit line BLT is transited to the core voltage level, whereas the bit line BLB is transited to the ground level. Such an erroneous data inversion occurs as the NMOS transistor N1, which was in an OFF state, is turned to an ON state due to an increase in gate voltage level, the NMOS transistor N2 is turned off, the PMOS transistor P1 is turned off, and the PMOS transistor P2 is turned on, in this order.

The erroneous data inversion is accelerated when the distance from the column select switch YS to the gate node of the NMOS transistor N1 is reduced, or when the skew between the NMOS transistors N1 and N2 is increased [(for example, when Vth (N1)<Vth (N2)]. FIG. 4 is a circuit diagram illustrating a transistor arrangement of the conventional bit line sense amplifier. In this transistor arrangement, erroneous data inversion may occur easily because the distance between the column select switch YS and the NMOS transistor N1 is short.

BRIEF SUMMARY

In one aspect of the present disclosure, a sense amplifier of a semiconductor device comprises first and second PMOS transistors connected to each other at sources of the first and second PMOS transistors, and first and second NMOS transistors connected to each other at sources of the first and second NMOS transistors, to detect and amplify a voltage difference between a bit line and a complementary bit line. The second NMOS and PMOS transistors are connected to the bit line via a column select switch at drains of the second NMOS and PMOS transistors. The first PMOS and NMOS transistors are connected to the bit line via the column select switch at gates of the first PMOS and NMOS transistors. The second NMOS transistor, the second PMOS transistor, the first PMOS transistor, and the first NMOS transistor are arranged, in this order, downstream from the column select switch.

When a read command is activated, the column select switch may connect the bit line to the local input/output line, and the bit line which is increased in potential due to a charge sharing between the bit line and the local input/output line.

The bit line has a potential lower than a potential of the local input/output line, and when charge is input to the bit line, upon an activation of a read command, the second NMOS transistor may sink the charge through a channel of the second NMOS transistor.

A bit line equalizer circuit may be arranged between the column select switch and the second NMOS transistor.

In accordance with another aspect of the present disclosure, a sense amplifier of a semiconductor device comprises first and second PMOS transistors connected to each other at sources of the first and second PMOS transistors, and first and second NMOS transistors connected to each other at sources of the first and second NMOS transistors, to detect and amplify a voltage difference between a bit line and a complementary bit line. The first NMOS transistor is connected to the bit line at a gate of the first NMOS transistor, and the second NMOS transistor is connected to the bit line at a drain of the second NMOS transistor. The first and second NMOS transistors are arranged such that the first NMOS transistor is physically spaced apart from a column select switch, farther than a space between the second NMOS transistor and the column select switch.

When a read command is activated, the column select switch may connect the bit line to the local input/output line, and the bit line is increased in potential due to a charge sharing between the bit line and the local input/output line.

When charge is input to the bit line, which has a potential lower than a potential of the local input/output line, upon an activation of a read command, the second NMOS transistor may sink the charge through a channel of the second NMOS transistor.

BRIEF DESCRIPTION OF THE DRAWINGS

The above and other features of the subject matter of the present disclosure will be more clearly understood from the following detailed description taken in conjunction with the accompanying drawings, in which.

DETAILED DESCRIPTION OF EXEMPLARY EMBODIMENTS

Preferred embodiments of the subject matter of the present disclosure will now be described in detail with reference to the accompanying drawings.

In accordance with an exemplary embodiment of the present disclosure, a sense amplifier of a semiconductor device is provided which can prevent an erroneous data inversion caused by an increase in the voltage of a bit line maintained at a potential lower than the potential of a local input/output line due to a charge sharing between the bit line and the local input/output line when a read command is input, and thus, can increase the level of the signal transferred to the local input/output line, thereby achieving an improvement in tRCD.

Figure 1:
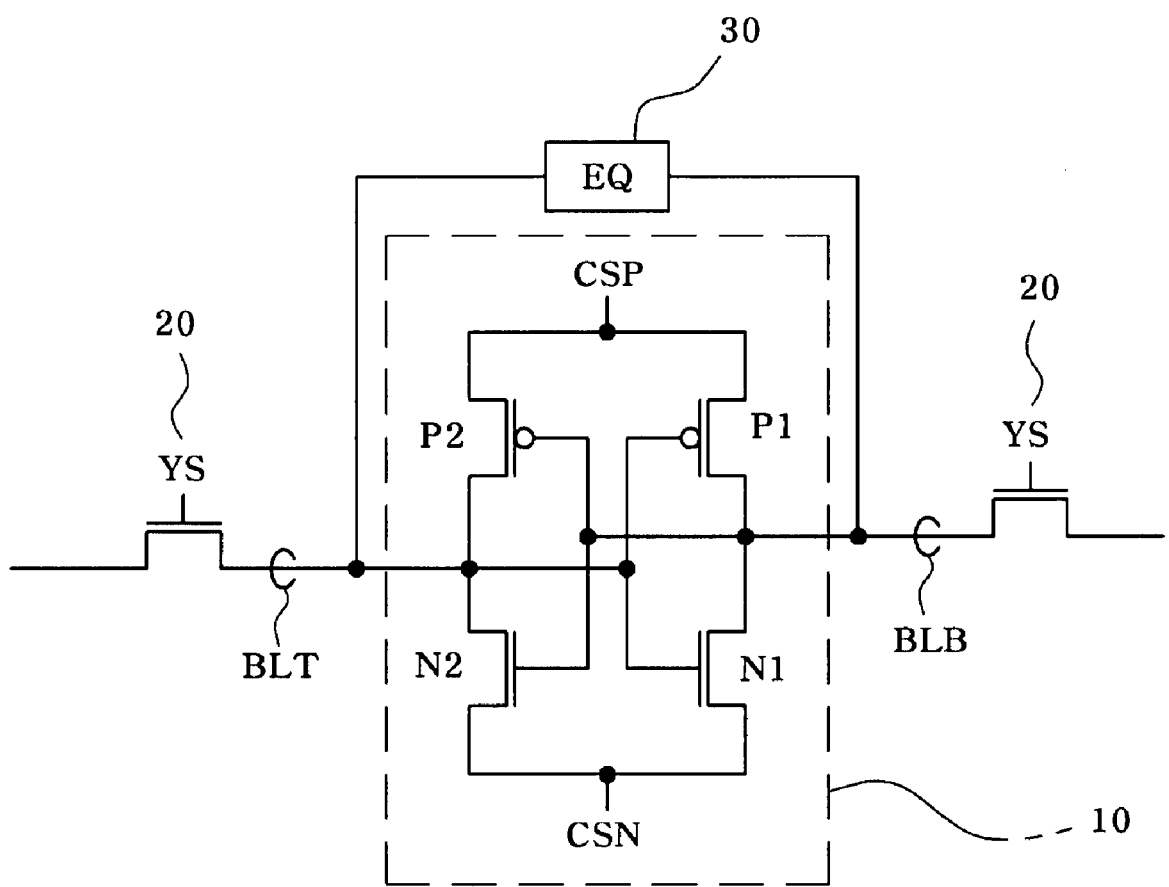
FIG. 1 is a circuit diagram illustrating a conventional sense amplifier used in a semiconductor device.
Figure 2:
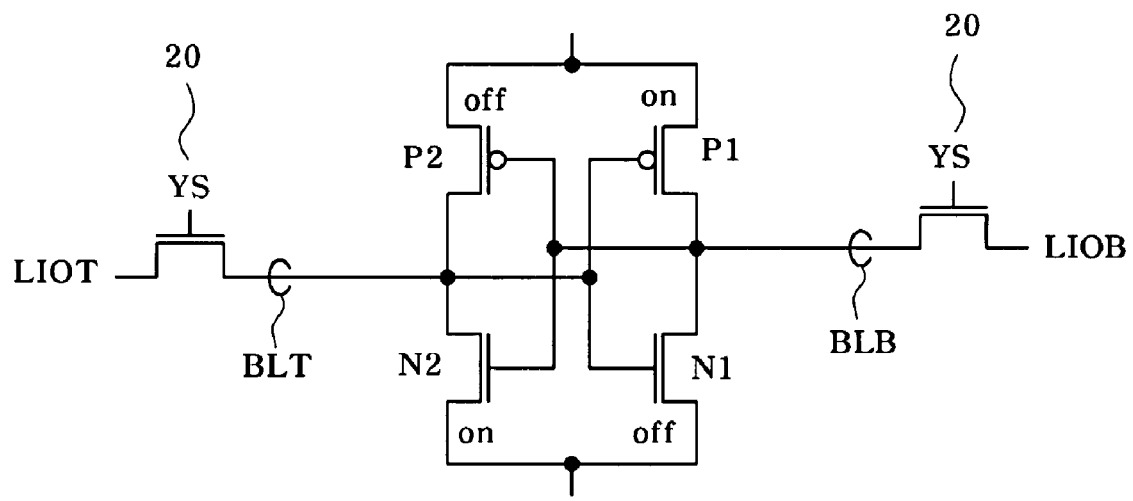
FIG. 2 is a circuit diagram for explaining an operation of the sense amplifier shown in FIG. 1, when a read command is input, while illustrating a waveform diagram of the sense amplifier.
Figure 2:
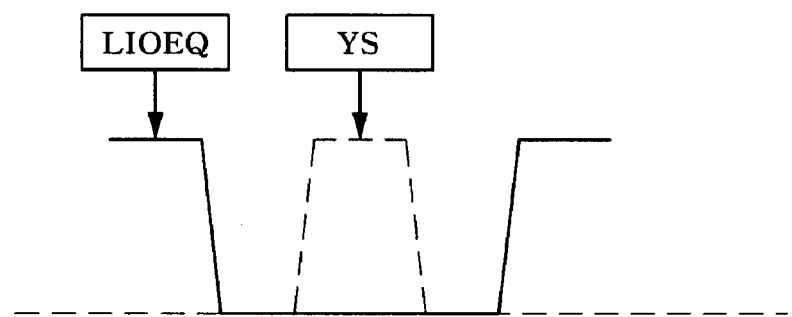
Figure 2:
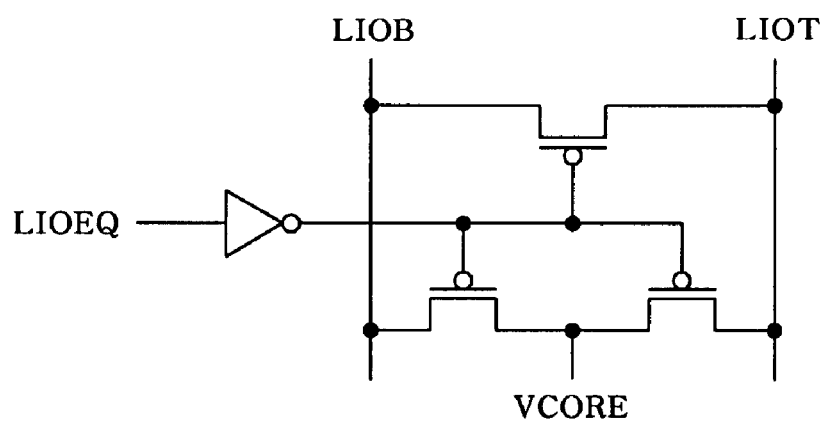
Figure 3:
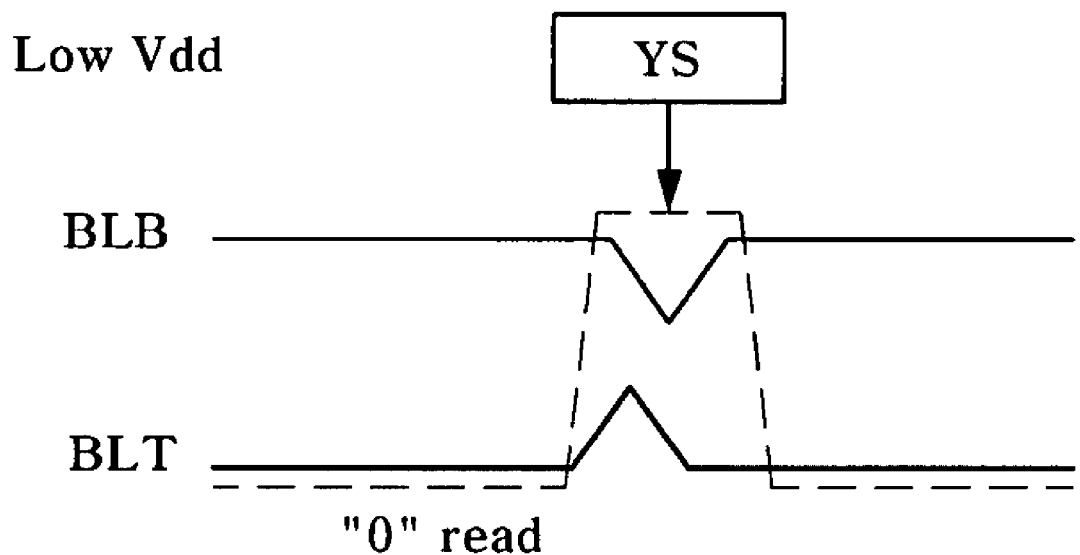
FIG. 3 is a waveform diagram for explaining an operation of the sense amplifier shown in FIG. 1, depending on the level of a supply voltage VDD.
Figure 3:
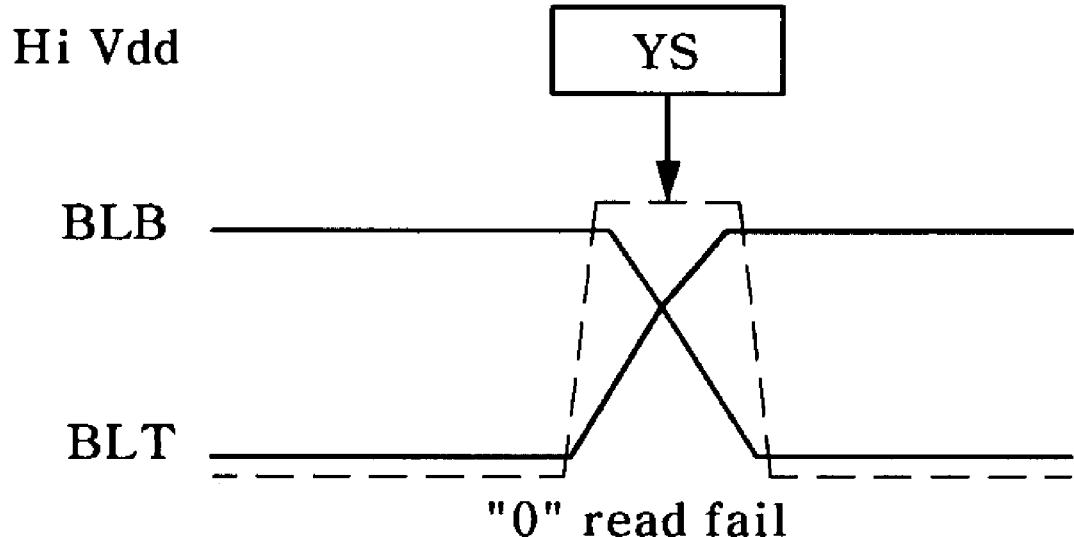
Figure 4:
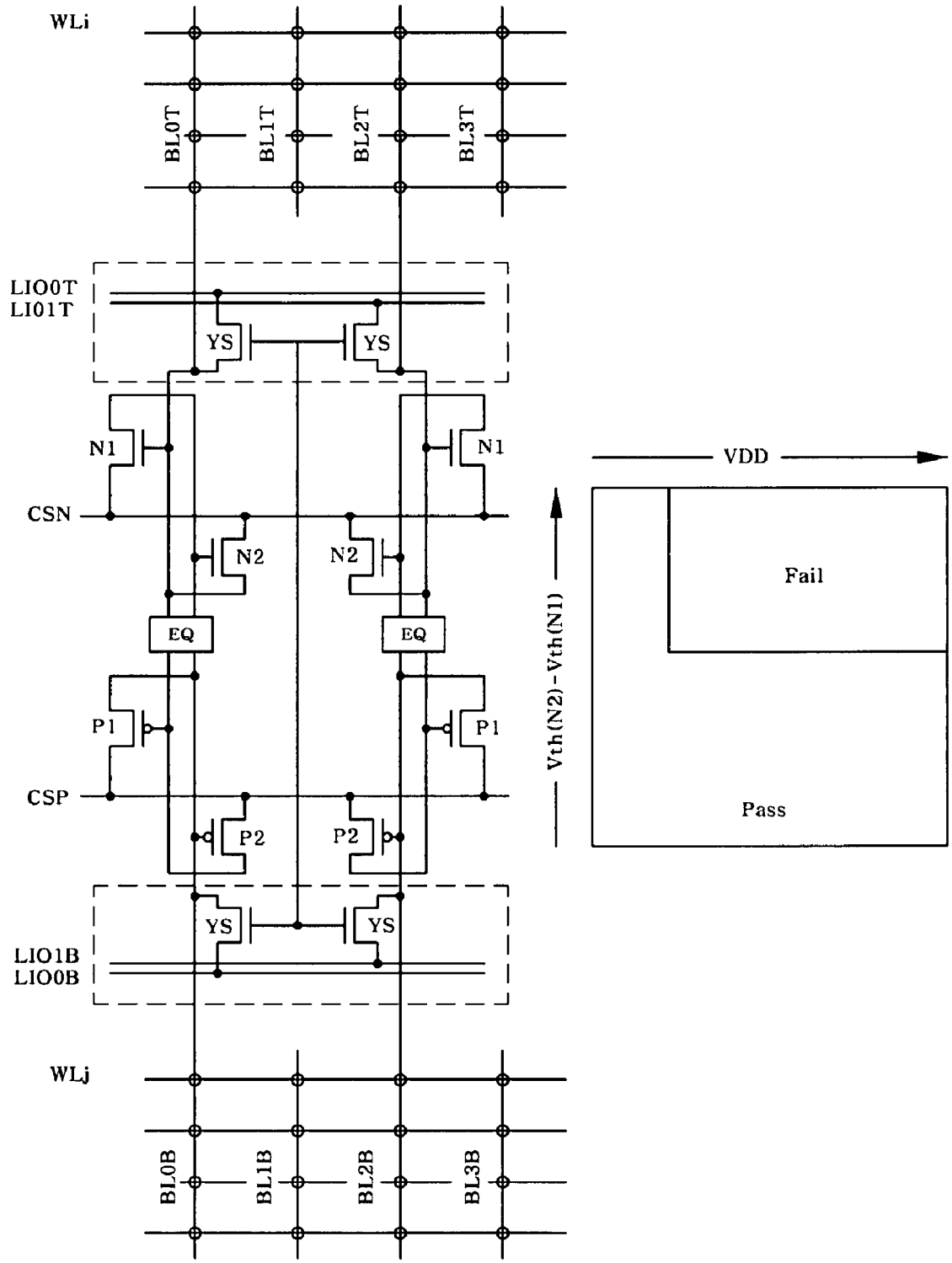
FIG. 4 is a circuit diagram illustrating a transistor arrangement of the conventional sense amplifier shown in FIG. 1.
Figure 5:
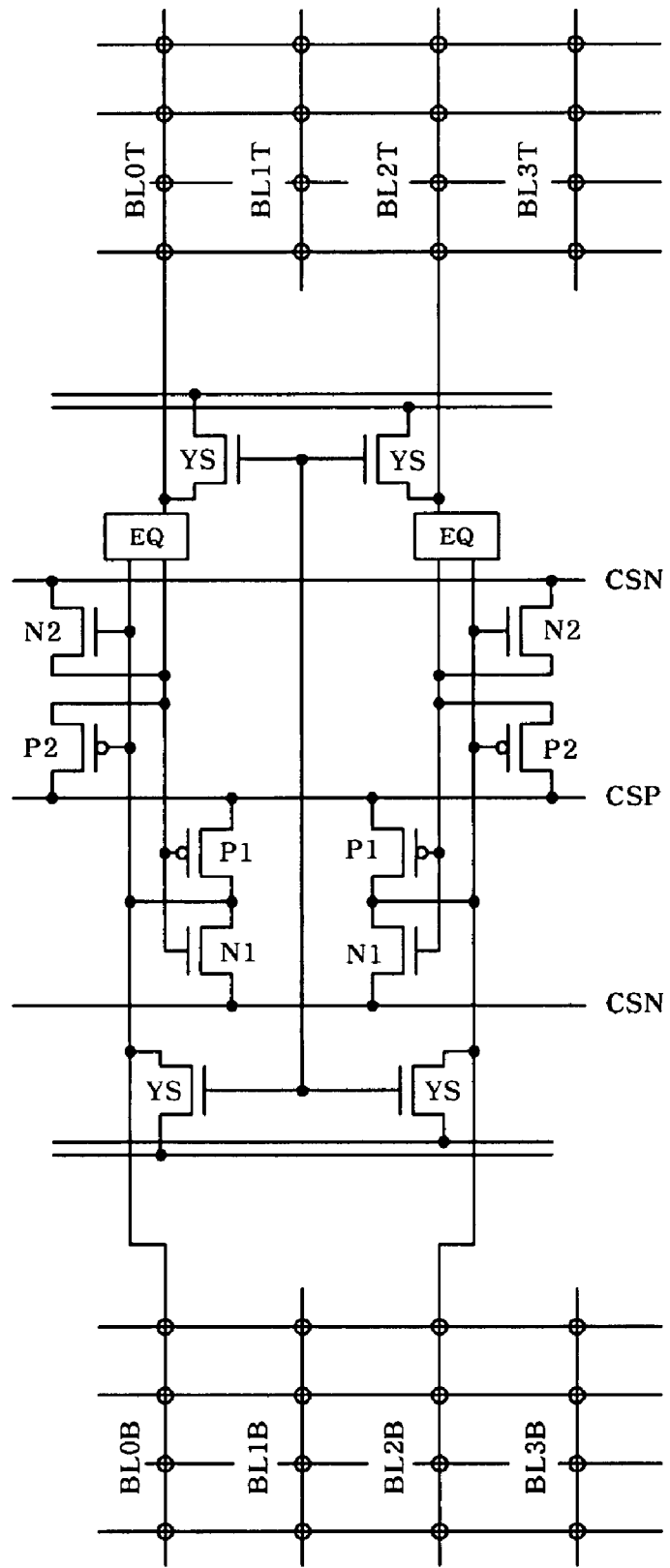
FIG. 5 is a circuit diagram illustrating a sense amplifier according to an exemplary embodiment of the present disclosure.

FIG. 5 is a circuit diagram illustrating a sense amplifier according to an exemplary embodiment of the present disclosure.

As shown in FIG. 5, the sense amplifier includes first and second PMOS transistors P1 and P2 connected to each other at the sources thereof, and first and second NMOS transistors N1 and N2 connected to each other at sources thereof, to detect and amplify a voltage difference between a bit line BLT and a complementary bit line BLB. In accordance with the illustrated embodiment of the present disclosure, the second NMOS transistor N2 and second PMOS transistor P2 are connected at the drains thereof to the bit line BLT via a column select switch YS, and the first PMOS transistor P1 and first NMOS transistor N1 are connected at the gates thereof to the bit line BLT via the column select switch YS. The first PMOS transistor P1, second PMOS transistor P2, first NMOS transistor N1, and first PMOS transistor P1 are arranged, in this order, downstream from the column select switch YS.

The bit line BLT is increased in potential due to a charge sharing when a read command is activated. When the read command is activated, the column select switch YS connects the bit line BLT to the local input/output line LIOT.

When charge is input to the bit line BLT maintained at a potential lower than that of the local input/output line LIOT, due to a charge sharing occurring between the local input/output line LIOT and the bit line BLT upon the activation of the read command, the second NMOS transistor N2, which is connected at the drain thereof to the bit line BLT, sinks the charge.

A bit line equalizer circuit EQ is arranged between the column select switch YS and the second NMOS transistor N2 connected, at the drain thereof, to the bit line BLT.

Figure 6:
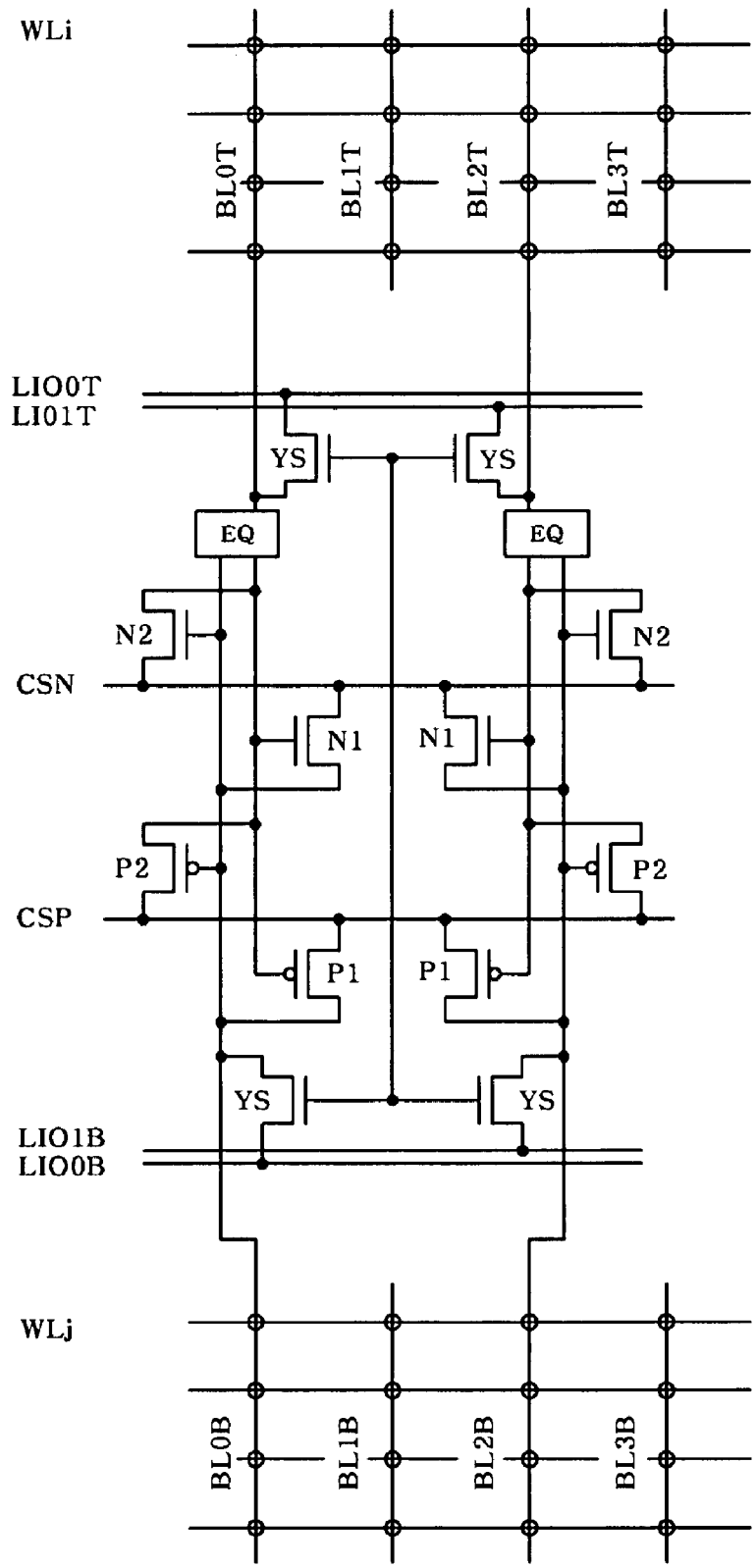
FIG. 6 is a circuit diagram illustrating a sense amplifier according to another exemplary embodiment of the present disclosure.

FIG. 6 is a circuit diagram illustrating a sense amplifier according to another exemplary embodiment of the present disclosure.

As shown in FIG. 6, the sense amplifier includes first and second PMOS transistors P1 and P2 connected to each other at the sources thereof, and first and second NMOS transistors N1 and N2 connected to each other at sources thereof, to detect and amplify a voltage difference between a bit line BLT and a complementary bit line BLB. In accordance with the illustrated embodiment of the present disclosure, the first NMOS transistor N1 connected at the gate thereof to the bit line BLT, and the second NMOS transistor N2 is connected at the drain thereof to the bit line BLT. Also, the first and second NMOS transistors N1 and N2 are arranged such that the first NMOS transistor N1 is physically spaced apart from a column select switch YS, farther than the second NMOS transistor N2.

The bit line BLT is increased in potential due to a charge sharing when a read command is activated. When the read command is activated, the column select switch YS connects the bit line BLT to the local input/output line LIOT.

When charge is input to the bit line BLT maintained at a potential lower than that of the local input/output line LIOT, due to a charge sharing occurring between the local input/output line LIOT and the bit line BLT upon the activation of the read command, the second NMOS transistor N2, which is connected at the drain thereof to the bit line BLT, sinks the charge.

A bit line equalizer circuit EQ is arranged between the column select switch YS and the second NMOS transistor N2 connected at the drain thereof to the bit line BLT.

Hereinafter, operation of the sense amplifier according to the present disclosure will be described in detail.

When a semiconductor device, to which the sense amplifier according to the present disclosure is applied, operates, the bit lines BLT and BLB of one bit line pair, which have been precharged with a voltage corresponding to ½ of a core voltage Vcore in a standby mode before the operation of the semiconductor device, are transited to voltage levels having a minute difference, respectively, as they receive data from associated cells.

When the sense amplifier operates in this state, the potentials of the bit lines BLT and BLB, which have a minute difference, are varied to levels corresponding to the core voltage Vcore and a ground voltage Vss, respectively.

For example, when the sense amplifier is operated in accordance with an active signal under the condition in which cell data has a logic value of "0", the first PMOS transistor P1 and second NMOS transistor N2 of the sense amplifier are turned on, whereas the first NMOS transistor N1 and second PMOS transistor P2 are turned off. As a result, the bit line BLT is transited to the ground voltage level, whereas the bit line BLB is transited to the core voltage level.

When a read command is subsequently input, the column select switch YS selected by a column decoding signal is turned on. In accordance with the ON state of the column select switch YS, a charge sharing occurs between the local input/output line LIOT and the bit line BLT maintained at a potential lower than that of the local input/output line LIOT, so that the potential of the bit line BLT is increased.

In this state, there is no variation in the potential of the bit line BLB because the bit line BLB has the same voltage level as the local input output line LIOB, namely, the core voltage level.

When charge is input from the local input/output line LIOT to the bit line BLT due to the charge sharing, it is sunk through the channel of the second NMOS transistor N2, which is arranged physically near the bit line BLT and is in an ON state, namely, a source node CSN. Accordingly, there is no increase in the potential of the bit line BLT.

On the other hand, the first NMOS transistor N1, which is physically spaced away from the column select switch YS, is attenuated in gate node voltage level. As a result, the first NMOS transistor N1 is stably maintained in an OFF state.

As described above, the first NMOS transistor N1 connected at the gate thereof to the bit line BLT and the second NMOS transistor N2 connected at the drain thereof to the bit line BLT are arranged such that the first NMOS transistor N1 is physically spaced apart from the column select switch YS connecting the local input/output line LIOT and the bit line BLT, which is increased in potential due to a charge sharing occurring when an activation of a read command, farther than the second NMOS transistor N2 is spaced apart from the column select switch YS.

In accordance with this transistor arrangement, charge input to the bit line BLT due to a charge sharing is sunk via the channel of the second NMOS transistor N2, which is arranged physically near the bit line BLT and is in an ON state, in order to prevent the potential of the bit line BLT from being increased.

Also, the first NMOS transistor N1, which is physically spaced away from the column select switch YS, is attenuated in gate node voltage level. As a result, the first NMOS transistor N1 is stably maintained in an OFF state.

Thus, the subject matter of the present disclosure prevents erroneous data inversion caused by a malfunction of the transistors of the sense amplifier, and enables the sense amplifier to be stably driven.

Although preferred embodiments of the disclosure have been disclosed for illustrative purposes, those skilled in the art will appreciate that various modifications, additions and substitutions are possible, without departing from the scope and spirit of the disclosure as disclosed in the accompanying claims. For example, elements and/or features of different examples and illustrative embodiments may be combined with each other and/or substituted for each other within the scope of this disclosure and appended claims.

The present application claims priority to Korean patent application number 10-2006-117154, filed Nov. 24, 2006, the entire contents of which are incorporated by reference herein.

What is claimed is:

1. A sense amplifier of a semiconductor device comprising first and second PMOS transistors connected to each other at sources of the first and second PMOS transistors, and first and second NMOS transistors connected to each other at sources of the first and second NMOS transistors, to detect and amplify a voltage difference between a specific bit line and a complementary bit line, wherein:

the second NMOS transistor and second PMOS transistor are connected to the specific bit line via a column select switch at drains of the second NMOS transistor and second PMOS transistor, and the first PMOS transistor and first NMOS transistor are connected to the specific bit line via the column select switch at gates of the first PMOS transistor and first NMOS transistor; and the second NMOS transistor, the second PMOS transistor, the first PMOS transistor, and the first NMOS transistor are arranged, in this order, downstream from the column select switch.

2. The sense amplifier according to claim 1, wherein, when a read command is activated, the column select switch connects the specific bit line to a local input/output line, and the specific bit line is increased in potential due to a charge sharing between the specific bit line and the local input/output line.

3. The sense amplifier according to claim 1, wherein the specific bit line has a first potential lower than a second potential of the local input/output line, and when charge is input to the specific bit line, upon an activation of a read command, the second NMOS transistor sinks the charge through a channel of the second NMOS transistor.

4. The sense amplifier according to claim 1, wherein a bit line equalizer circuit is arranged between the column select switch and the second NMOS transistor.

5. A sense amplifier of a semiconductor device comprising first and second PMOS transistors connected to each other at sources of the first and second PMOS transistors, and first and second NMOS transistors connected to each other at sources of the first and second NMOS transistors, to detect and amplify a voltage difference between a specific bit line and a complementary bit line, wherein:

the first NMOS transistor is connected to the specific bit line at a gate of the first NMOS transistor, and the second NMOS transistor is connected to the specific bit line at a drain of the second NMOS transistor; and the first and second NMOS transistors are arranged such that the first NMOS transistor is physically spaced apart from a column select switch by a first distance greater than a second distance between the second NMOS transistor and the column select switch.

6. The sense amplifier according to claim 5, wherein, when a read command is activated, the column select switch connects the specific bit line to the local input/output line, and the specific bit line is increased in potential due to a charge sharing between the specific bit line and the local input/output line.

7. The sense amplifier according to claim 5, wherein the specific bit line has a potential lower than a potential of the local input/output line and when charge is input to the bit line, upon an activation of a read command, the second NMOS transistor sinks the charge through a channel of the second NMOS transistor.

8. The sense amplifier according to claim 5, wherein a bit line equalizer circuit is arranged between the column select switch and the second NMOS transistor.

* * * * *